United States Patent [19]

Chevallier

[11] Patent Number: 5,629,644
[45] Date of Patent: May 13, 1997

[54] ADJUSTABLE TIMER CIRCUIT

[75] Inventor: Christophe J. Chevallier, Palo Alto, Calif.

[73] Assignee: Micron Quantum Devices, Inc., Santa Clara, Calif.

[21] Appl. No.: 509,035

[22] Filed: Jul. 28, 1995

[51] Int. Cl.$^6$ .................. H03K 3/023; H03K 5/13
[52] U.S. Cl. .............. 327/393; 327/172; 327/132; 327/263
[58] Field of Search .................... 327/394, 393, 327/172, 176, 291, 263, 392, 103, 131, 132, 134, 135, 101; 323/315; 331/111, 143

[56] References Cited

U.S. PATENT DOCUMENTS

| | | | |
|---|---|---|---|
| 3,831,113 | 8/1974 | Ahmed | 327/132 |
| 4,584,494 | 4/1986 | Arakawa et al. | 327/176 |
| 4,607,238 | 8/1986 | Kohsiek | 331/143 |
| 4,608,530 | 8/1986 | Bacrania | 323/315 |
| 4,620,312 | 10/1986 | Yamashita | 327/176 |
| 4,812,687 | 3/1989 | Larson et al. | 327/263 |
| 4,981,358 | 1/1991 | McBrien et al. | 327/134 |
| 5,003,194 | 3/1991 | Engelhard | 327/173 |
| 5,047,664 | 9/1991 | Moyal | 307/303 |
| 5,130,582 | 7/1992 | Ishihara et al. | 327/392 |
| 5,233,315 | 8/1993 | Verhoeven | 331/45 |
| 5,345,196 | 9/1994 | Mahant-Shetti et al. | 327/101 |
| 5,352,934 | 10/1994 | Khan | 327/103 |
| 5,371,770 | 12/1994 | Sakuma | 327/291 |
| 5,387,882 | 2/1995 | Schoofs | 327/131 |
| 5,391,979 | 2/1995 | Kajimoto et al. | 323/313 |
| 5,455,522 | 10/1995 | Jones | 326/27 |
| 5,469,100 | 11/1995 | Wuidart et al. | 327/263 |

FOREIGN PATENT DOCUMENTS 5-122052A  5/1993  Japan ........................ 326/81

Primary Examiner—Timothy P. Callahan
Assistant Examiner—Eunja Shin
Attorney, Agent, or Firm—Limbach & Limbach L.L.P.

[57] ABSTRACT

An adjustable timer circuit capable of producing accurate pulse outputs having a wide range of periods. The timer circuit includes a timing capacitor and an associated current source for producing a reference current having a magnitude which is derived from a reference voltage. A current divider is used to divide the reference current down to a smaller current used for charging the timing capacitor. A comparator circuit is provided for comparing the voltage produced across the timing capacitor with a comparison voltage also derived from the reference voltage. The timing capacitor is discharged in response to the comparator output so that subsequent output pulses can be produced. The current divider is adjustable in response to a mode control signal so that different magnitude charging currents can be produced which results in different magnitude pulse width outputs.

59 Claims, 6 Drawing Sheets

ADJUSTABLE TIMER CIRCUIT

BACKGROUND OF THE INVENTION

1. Field of the Invention

The present invention relates generally to timer circuits and in particular to adjustable timer circuits which may be implemented completely in integrated circuit form and which is capable of providing relatively long duration timing pulses.

2. Background Art

In many integrated circuits, there is a requirement that certain functions be carried for a relatively precise time period. By way of example, in flash memory systems, the memory cells are programmed and erased by application of certain voltages to the flash memory cells for a fixed duration of time. A typical programming pulse may have a duration on the order of one microsecond. A typical erase pulse may have a duration on the order of one to a hundred milliseconds.

One conventional approach for generating pulses having durations which may vary three or more orders of magnitude is to generate a high frequency clock. This clock is used to produce the short duration programming pulses and a frequency divider circuit is used to divide the clock frequency down to provide the long duration pulses used in erasing. One disadvantage of this approach is that the frequency divider circuit must have a large number of stages to provide the desired long duration output pulses. In addition, many conventional timing circuits capable of being completely implemented in integrated circuit form do not provide the absolute accuracy often necessary in many applications such as flash memory systems.

The present invention pertains to an adjustable timer circuit which may be completely implemented in integrated circuit form and which has a relatively high absolute accuracy. In addition, the subject timer circuit is capable of providing a wide range of timing pulse outputs such as required in flash memory applications without resorting to a large frequency divider circuit. These and other advantages of the present invention will become apparent to those skilled in the art upon a reading of the following Detailed Description of the Invention together with the drawings.

SUMMARY OF THE INVENTION

A timer circuit is disclosed capable of producing output pulses having a wide range of durations. The timer circuit includes a timing capacitor and an associated current source means for producing a reference current having a magnitude derived from a reference voltage. A current divider means is included for producing a charging current in the timing capacitor having a magnitude which is equal to the magnitude of the reference current divided by N, where N is greater than one. The value of N is preferably adjustable for different modes of operation.

The timer circuit further includes comparator means for comparing a magnitude of a voltage produced across the timing capacitor by the charging current with a comparison voltage having a magnitude derived from the reference voltage and producing a comparator output based upon the comparison. Output means is included for producing the timer output in response to the comparator output. Typically, the output means includes a one shot for indicating the termination of the output pulse.

DETAILED DESCRIPTION OF THE INVENTION

Figure 1:
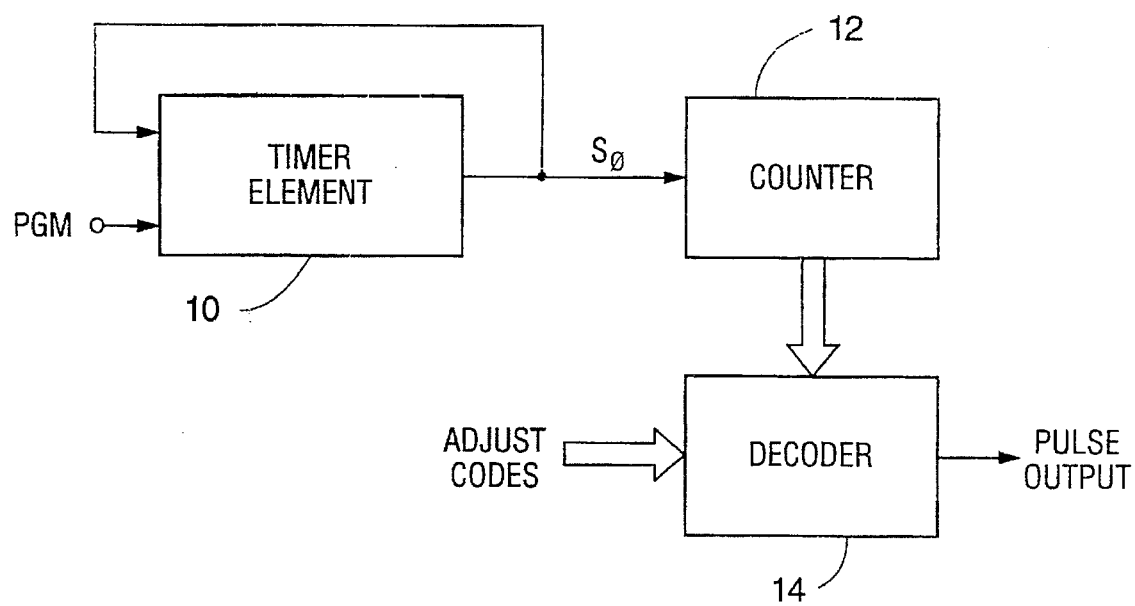
FIG. 1 is a block diagram of the subject timer circuit incorporated into a timer system.

Referring to the drawings, FIG. 1 is a block diagram of the subject adjustable timer circuit which is adapted for incorporation into a flash memory system. The timer circuit includes a timer element 10 for generating an output pulse $S_O$ which occurs a relatively precise time period after the timer circuit is triggered. The output pulse $S_O$ is fed back to an input of the timer element 10 so that the timer element can retrigger itself. In addition, the output pulse $S_O$ is used to clock a counter 12, with the counter having multiple outputs for driving a programmable decoder 14. The decoder 14 provides a pulse output, the duration of which is a function of certain stored parameters which control the decoder.

Timer element 10 is itself programmable based upon the memory operation to be performed. In the event a pulse is to be used to program a memory cell, program signal PGM will be active and cause the output $S_O$ to have a duration on the order of one to a hundred microseconds. In the event an erase operation is to take place, signal PGM will be inactive and the timer element $S_O$ will have a duration on the order of one to a hundred milliseconds.

Figure 2:
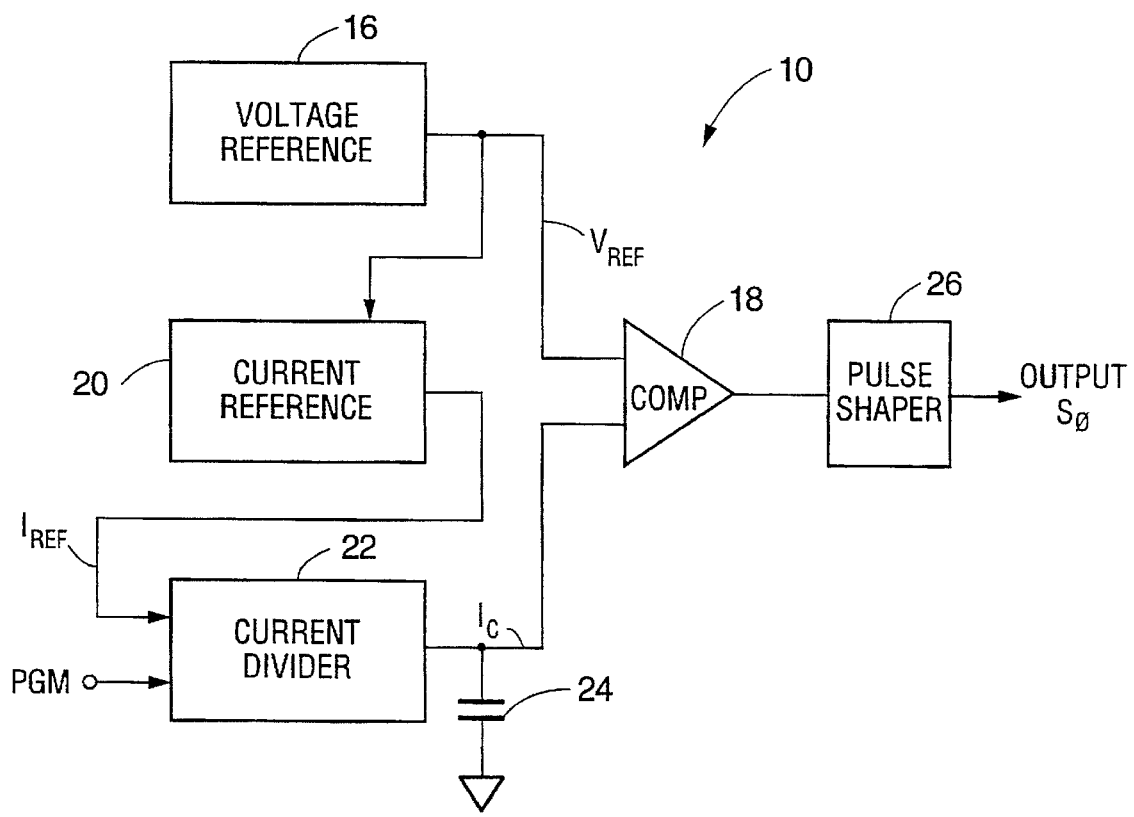
FIG. 2 is a block diagram of the subject timer circuit.

FIG. 2 shows additional details of the timer element 10 of FIG. 1. The timer element includes a voltage reference which produces a reference voltage $V_{REF}$ which is forwarded to a current reference stage 20. The current reference stage 20 produces a reference current $I_{REF}$ based upon the reference voltage $V_{REF}$ which is received by a current divider stage 22. The current divider provides an output current $I_C$, the magnitude of which is controlled by the program signal PGM which is used to charge a timing capacitor 24.

A comparator 18 is included which compares the voltage drop across timing capacitor 24 with the reference voltage $V_{REF}$. Current $I_C$ has a fixed magnitude which produces a ramp voltage across timing capacitor 24 with a fixed rate of change with respect to time. Thus, the duration of the pulse output of comparator 18 will be relatively constant and will be dependent essentially only on the value of $V_{REF}$ and the value of timing capacitor 24. The output of the comparator 18 is conditioned by pulse shaping circuitry 26 to provide the timer element output $S_O$.

Figure 3:
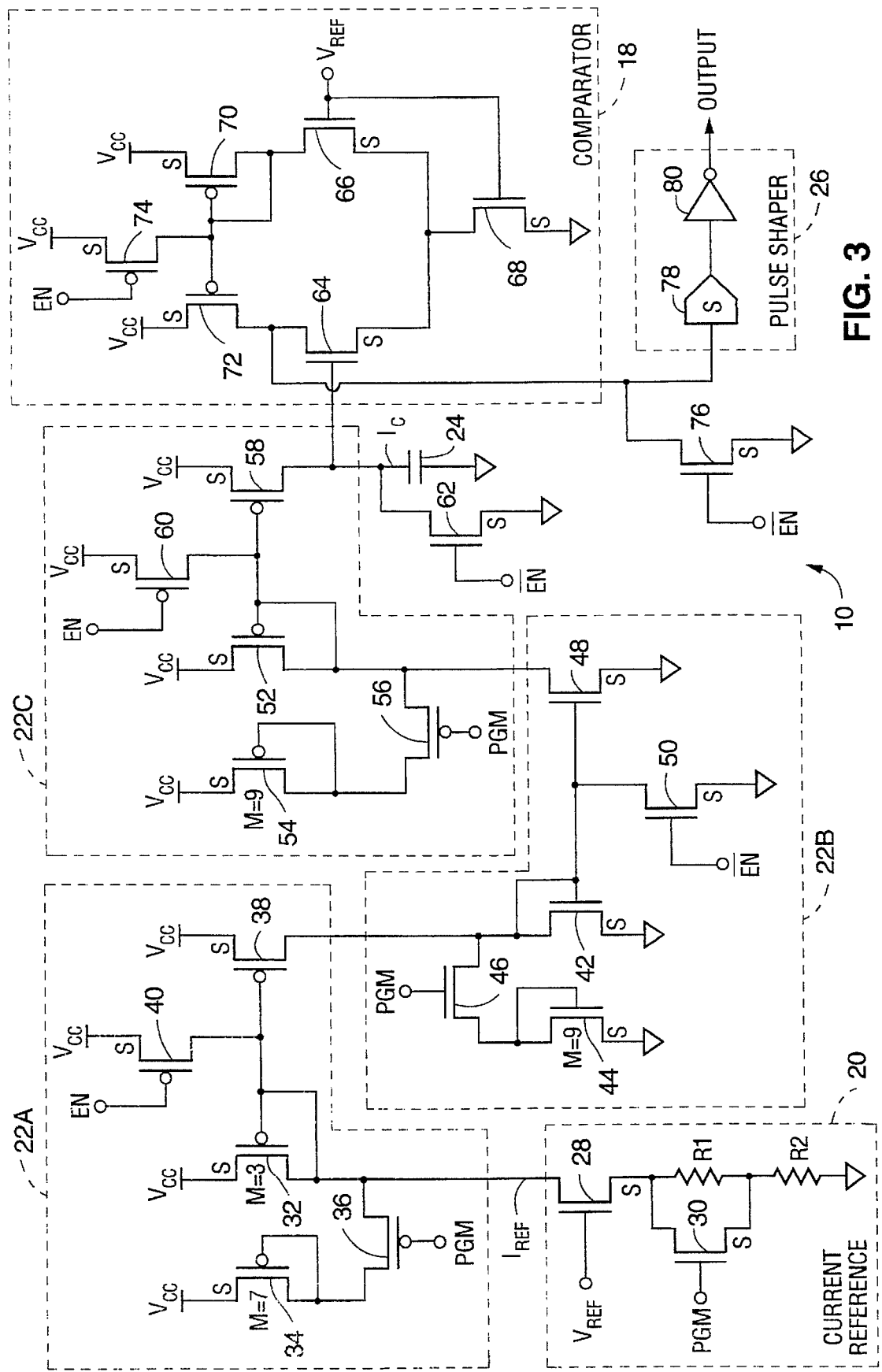
FIG. 3 is a detailed schematic diagram of the principal components of the subject timer circuit.

FIG. 3 shows additional details of the timer element 10. The current reference 20 receives the reference voltage $V_{REF}$ which is connected to the gate of an N channel transistor 28. The source of transistor 28 is connected to the series connection of resistors R1 and R2. A second N channel transistor 30 is connected across resistor R1 and has its gate connected to the program signal PGM. The voltage across resistors R1 and R2 is equal to the reference voltage $V_{REF}$, less the gate-source voltage of transistor 28. The magnitude of the reference current $I_{REF}$ is determined by the voltage across resistors R1 and R2 and the value of those resistors.

Voltage $V_{REF}$ may be generated by any suitable reference voltage generator circuit and is constant with respect to the power supply voltages of memory system, including primary supply voltage $V_{CC}$, and temperature and process variations. In order to make the gate-source voltage of transistor 28 to be close to the threshold voltage of that device, transistor 28 is made to be relatively large in terms of the ratio of the channel width to length (W/L). In addition, the magnitude of the reference current $I_{REF}$ through the transistor 28 is maintained at a relatively low value in the range of 0.1 milliamperes so that the gate-source voltage will approach the threshold voltage.

Resistors R1 and R2 are made to have relatively small resistances, in the range of 10 kohm to 20 kohm total resistance. Large value resistances have relatively long lengths compared to their widths and are susceptible to minor variations in width due to the so-called edge effect. This sensitivity is reduced by using smaller values of resistors where the total value of resistance is less susceptible to variations in width. The total resistance is made to be small since a wide resistor, which also has a large overall resistance, will occupy an unduly large amount of die area.

When the memory system is in a programming mode, signal PGM is high so that resistor R1 is effectively shorted out. This will cause the value of the reference current $I_{REF}$ to increase to a program reference current $I_{REFP}$. As will be explained, the high signal PGM will also change the operation of the current divider 22 so that the charge current $I_C$ in the program mode is further increased. The increase to the program reference current $I_{REP}$ in combination the increase in current due to the change in operation of the current divider 22, will cause the value of the charge current $I_C$ to increase thereby reducing the duration of the time period from the triggering of the timer element 10 to the generation of the pulse output $S_O$ during programming to a period on the order of one microsecond.

When the memory system is in the erase mode, signal PGM is low and transistor 30 is off. Thus, the effective resistance will be the sum of R1 and R2 and the value of the reference current $I_{REF}$ will be reduced to the erase reference current $I_{REFE}$. In addition, the operation of the current divider 22 will change so as to further decrease the charge current $I_C$. These two factors will cause the charge current $I_C$ to be reduced thereby increasing output pulse duration so that time period from the triggering of the timer element 10 to the generation of the pulse output $S_O$ is on the order of one millisecond.

The two reference currents $I_{REFP}$ and $I_{REFE}$ differ by only approximately 10% in magnitude, therefore the adjustment of inserting or deleting resistor R1 is only used as a trim feature. As will be explained, the large difference in the final timing capacitor 24 charging current when PGM is active versus inactive is achieved by way of the current divider 22.

As can be seen from the foregoing, it is desirable to make the reference current $I_{REF}$ small so that the pulse duration is large. However, it is difficult to fabricate a stable large resistance due to the aforementioned edge effect, without using a very large amount of die area. Accordingly, the reference current $I_{REF}$, as will be explained in greater detail, is further reduced by the current divider 22 (FIG. 2), with the current divider being programmable to provide a first charge current $I_{CP}$ during programming operations and a second charge current during non-programming operations, $I_{CE}$, such as erase. The current divider 22 is implemented so that the program charge current $I_{CP}$ is equal to the reference current $I_{REFP}$ divided by three during the programming mode. In addition, the divider 22 is implemented so that the erase charge current $I_{CE}$ is equal to the erase reference current $I_{REFE}$ divided by one thousand.

The current divider 22 of the timer element 10 includes a first stage 22A, a second stage 22B and a third stage 22C. Each of the current mirror stages includes a mirror input and a mirror output. The first stage 22A includes a mirror input comprising three identical P channel transistors connected in parallel (M=3) which are represented by transistor 32. Transistor 32 is connected as a diode with its drain and gate connected together and has its source connected to the primary supply voltage $V_{CC}$. The first stage 22A mirror input further includes seven identical P channel transistors (M=7) connected in parallel which are represented by transistor 34. Transistor 34 is also connected as a diode with the drain and gate connected together and the source connected to the primary supply voltage $V_{CC}$.

Transistors 32 and 34 have their drains coupled together by a P channel transistor 36 connected as a pass transistor. When the program signal PGM applied to the gate of transistor 36 is inactive (low), the transistor is on, effectively connecting the seven transistors 34 in parallel with the three transistors 32 so as to provide a mirror input of ten transistors. When PGM is active (high), the mirror comprises the three transistors 32. The ten individual transistors which make up transistors 32 and 34 are sometimes referred to as sub-transistors and the transistors 32 and 34 are sometimes referred to as either transistors or transistor structures, with a transistor structure being defined as encompassing either a single transistor or plural transistors.

The mirror output of stage 22A includes a single P channel transistor 38 having its gate connected to the gates of transistors 32 and its source connected to the primary supply voltage. Transistor 38 is identical to the ten transistors which make up transistors 32 and 34. A P channel enable transistor 40 is connected between the gates of transistors 32 and 38 and the primary supply voltage $V_{CC}$. An enable signal EN is connected to the gate of transistor 40 which is active high. Thus, when the enable signal is active, transistor 40 is off and when it is inactive, transistor 40 is conductive thereby disabling current mirror stage 22A.

In operation, the input of current mirror stage 22A is caused to draw current $I_{REF}$ through the drain-sources of the three sub-transistors which make up transistor 32 by current reference 20 when program signal PGM is active (transistor 36 is off). This causes a corresponding gate-source voltage to be produced in transistors 32. This gate-source voltage is dropped across transistor 38 causing current $I_{REF}$ to be mirrored in that transistor. All of the four transistors 32 and 38 will draw the same amount of current, $I_{REF}/3$. Accordingly, the current out of the current mirror first stage 22A, the current flow through transistor 38 will be $I_{REF}/3$.

If the program signal PGM is inactive, thereby indicating an erase operation (among others), transistor 36 is conductive. In that event, reference current $I_{REF}$ will be equally divided among the ten sub-transistors which make up transistors 32 and 34 of the input. Thus, the current in the output transistor 38 will be equal to that of any one of the input transistors, namely, $I_{REF}/10$.

Thus, since the ten transistors 32 and 34 of the first current mirror stage 22A are of the same construction and have the same ratio of channel width to channel length, the input of the current mirror stage can be viewed as being a single transistor structure having an effective ratio of channel width to channel length which is can be precisely controlled relative to the ratio of channel width to channel length of the output transistor 38. Such precision is due, in part, to the fact that it is possible to make multiple transistors which are almost identical to one another. In one instance, when PGM is active (transistor 36 is off), the value of the input transistor ratio relative to the value of the output transistor ratio is precisely three to one. When PGM is inactive, transistor 36 is conductive and the value is precisely ten to one.

The output of the first stage 22A of the current divider (transistor 38) is connected to the input of the second current mirror stage 22B. The input of stage 22B includes a single N channel transistor 42 connected as a diode. Transistor 42 may be selectively connected in parallel by way of transistor 46 to nine (M=9) N channel sub-transistors 44, each also connected as a diode. Transistor 46 is controlled by the inverted program signal $\overline{PGM}$. Thus, when the program signal PGM is active, signal $\overline{PGM}$ is inactive (high) thereby turning on transistor 46 so that the mirror input comprises a total of ten identical transistors 42 and 44. When signal $\overline{PGM}$ is active (low), the mirror input comprises one transistor 42.

The mirror output of the second stage 22B is single transistor 48 having its gate connected to the gates of the transistors of the mirror input. An N channel transistor 50 is connected between the gates of transistors 42 and 48 and the circuit common and has its gate connected to the inverse of the enable signal EN, signal $\overline{EN}$. Thus, when the circuit is enabled, signal $\overline{EN}$ is low thereby causing transistor 50 to remain off, otherwise transistor 50 is conductive and functions to disable the second current mirror stage 22B.

Since transistors 42 and 48 are each single transistors and since transistor 44 comprises nine sub-transistor, the second stage functions to divide the input current to the second stage by either ten if the inverted program signal $\overline{PGM}$ is inactive (high) or by one if the signal is active.

The output of the second current mirror stage 22B, the drain of transistor 48, is connected to the input of the third mirror stage 22C. The input of the third stage includes the drain of single P channel transistor 52 and the drains of nine (M=9) P channel transistors 54 if transistor 56 is made conductive by an inactive program signal PGM. Single P channel transistor 58 forms the output of the third mirror stage. Thus, the third mirror stage will divide the input current by ten if the program signal PGM is active and will divide by one if the signal is active.

In summary, if the program signal PGM is inactive, the output of the current divider 22, current $I_{CE}$ is $I_{REFE}/1000$. If the program signal is active, the output of the current divider, current $I_{CP}$ is $I_{REF}/3$. Currents $I_{CE}$ and $I_{CP}$ are used to charge timing capacitor 24. An N channel transistor 62 is connected across timing capacitor 24 and functions to hold the capacitor in a discharged stage when the inverted enable signal $\overline{EN}$ is inactive (high). When the signal $\overline{EN}$ is active, timing capacitor 24 is charged by the output current $I_C$ of the current divider, with $I_C$ being equal to either $I_{CE}$ or $I_{CP}$ depending upon whether the program signal PGM is active.

The timer element 10 further includes the comparator circuit 18. The voltage across timing capacitor 24 is connected to one input of the comparator circuit 18. Circuit 18 includes a pair of differentially-connected N channel input transistors 64 and 66. The common source connection of transistors 64 and 66 is connected to a tail current source in the form to an N channel transistor 68. Current source transistor 68 is biased by the reference voltage $V_{REF}$.

Comparator circuit 18 further includes a pair of P channel transistors 70 and 72 connected as current mirror loads for the input transistors 64 and 66. Transistor 70 has its gate and source connected together and to the gate of transistor 72 and to the drain of another P channel transistor 74, with the source of transistor 74 connected to supply voltage $V_{CC}$. The gate of transistor 74 is connected to the enable signal EN which is active high. Thus, when active, signal EN will turn transistor 74 off and when inactive, will turn transistor 74 on thereby disabling comparator circuit 18.

The reference voltage $V_{REF}$ is connected to the remaining input of the comparator circuit, the gate of transistor 66. Thus, when the voltage across timing capacitor 24 is less than $V_{REF}$, the output of the comparator circuit 18 at the common drains of transistors 64 and 72 is at a relatively high level and when the capacitor voltage is slightly higher than the reference voltage, the output of the comparator circuit 18 is at a relatively low level.

The output of comparator circuit 18 is connected to the input of pulse shaper circuit 26. Circuit 26 includes a Schmidt trigger circuit 78. When the output of the comparator circuit is at the high level, the output of trigger circuit 78 is at a low level. When the comparator circuit drops down to a first threshold voltage, the output of the trigger circuit goes high. The rate of change of the voltage across timing capacitor 24 is slow so that the comparator circuit 18 will be in the region where it is switching states for a significant amount of time. Any noise present on the comparator inputs at this point is likely to cause the comparator to switch states. The trigger circuit 78 provides a degree of hysteresis so as to increase immunity to noise. Circuit 78 is implemented so that the threshold voltage is increased from the first voltage to a higher second threshold voltage. This helps to prevent the trigger circuit 78 output from changing back to the low state due to noise on the system.

The trigger circuit 78 output is inverted by an inverter 80 so that the output of the timer element 10 is a falling edge. An N channel transistor 76 is connected between the input of the pulse shaper circuit 26 and circuit common. The gate of transistor 76 is connected to the inverted enable signal $\overline{EN}$ so that the input of the pulse shaper circuit 26 will be functional when the enable signal $\overline{EN}$ is present and grounded when it is not present.

Figure 4:
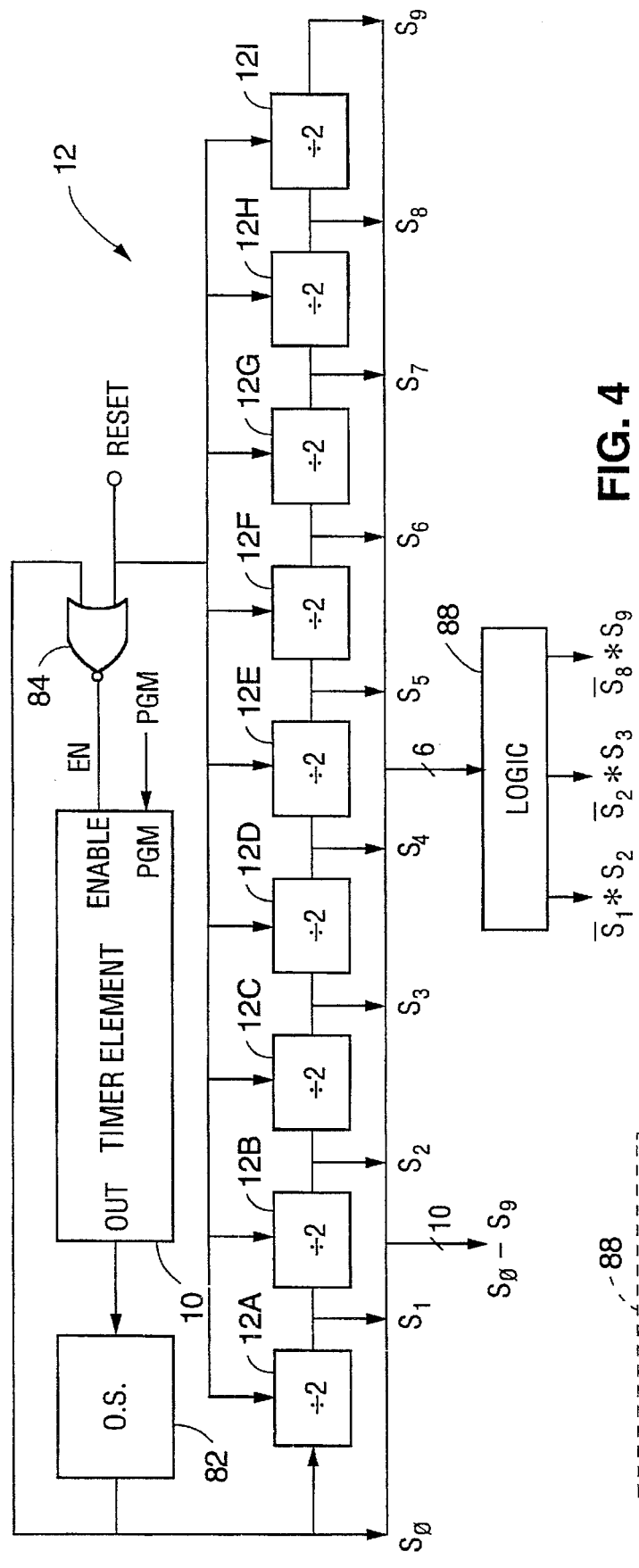
FIG. 4 is a detailed schematic diagram of the frequency divider and part of the decoder circuitry to be used in connection with the timer element of the present invention.

Referring to FIG. 4, the timer element 10 output is forwarded to a one shot circuit 82 which produces a short output pulse $S_O$ (typically 50 nanoseconds) on the falling edge of the timer element 10 output. Thus, signal $S_O$ is produced at the termination of each timer element 10 time period. When the timer element 10 is switched to the program mode (signal PGM is active), the output of the timer element 10 has a duration of 1.5 microseconds. When the timer element is in a non-program mode (signal PGM is inactive), the output of the timer element 10 has a duration of 0.4 milliseconds. This difference in three orders of magnitude is attributable the difference in the magnitude of the timing capacitor charging current $I_C$ for programming $I_{CP}$ and for non-programming $I_{CE}$. This difference is achieved by both the programmable current divider 22 (divide by 3 or divide by 1000) and the insertion and removal of resistor R1 from the current reference 20 (FIG. 3).

The output of the one shot 82 (FIG. 4) is fed back to the enable input of timer element 10 by way of a NOR gate 84. Thus, when signal $S_0$ is active (high), the enable signal EN goes momentarily inactive ($\overline{EN}$ active) thereby causing, among other things, transistor 62 (FIG. 3) to turn on. This will cause timing capacitor 24 to be discharged. Once the enable signal EN goes active at the end of the short duration pulse produced by one shot 82, the timer element will proceed to charge capacitor 24 again so that a further timer element 10 output will be produced. This process will continue unless the memory system generates a signal Reset which is applied to a second input of NOR gate 84 (FIG. 4). As long as signal Reset is present, signal enable EN will remain inactive (low) forcing the timer element to remain in a reset state.

The output of one shot 82, signal $S_0$, is coupled to the input of counter 12 (FIG. 4) which has nine stages 12A–12I. Each stage includes a D type flip-flop having an output connected back to the input so as to provide a divide-by-two function. The counter 12 thus produces nine timing outputs $S_1$–$S_9$ which are forwarded to various decoding circuitry. The counter 12 stages are each reset by signal Reset. The decoding logic includes a Logic element 88 which receives five of the timing signals ($S_1$, $S_2$, $S_3$, $S_8$ and $S_9$) from counter 12. The Logic elements logically combines the six timing signals to provide three decoded outputs including $\overline{S}_1 * S_2$, $\overline{S}_2 * S_3$ and $\overline{S}_8 * S_9$ (*=AND). As will be explained in greater detail, these outputs are selected to provide certain desired predetermined output pulse widths for carrying out memory operations such as programming.

Figure 6:
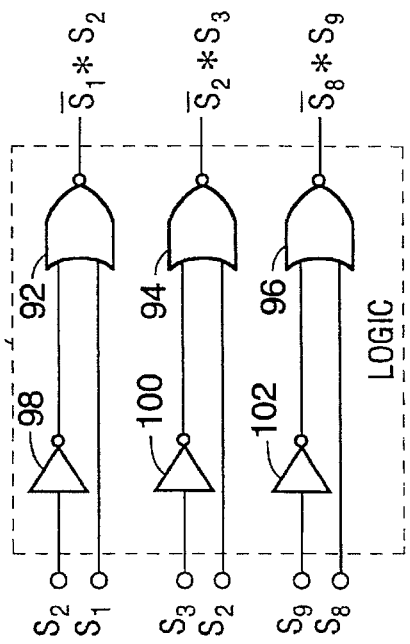
FIG. 6 is a detailed schematic diagram of part of the decoder circuit of the FIG. 4 diagram.

FIG. 6 shows the implementation details of the Logic element 88. The element includes three NOR gates 92, 94 and 96 and three inverter. The six timing signals $S_N$ are coupled to the appropriate inputs to the logic gates to provide the three outputs. By way of example, timing Signal $S_2$ is connected to inverter 98, the output of which is connected to one input of NOR gate 92. Timing signal $S_1$ is connected to the second input of the NOR gate 92 the output of which is signal $\overline{S}_1$ and $S_2$ ANDed together ($\overline{S}_1 * S_2$).

The exemplary memory system provides a total of three types of pulses used in memory operations. Pulses are provided for Programming operations and Erasing operations. In addition, pulses are provided for operations which are performed for the purpose of reducing the distribution of erased threshold voltages after an erase operation has been completed. This type of operation, sometimes referred to as a Heal operation, requires pulses having a duration on the order of those used in memory erase operations. Thus, the timer element 10 is placed in the non-program state (PGM inactive) when Heal operations are to be performed.

Figure 5:
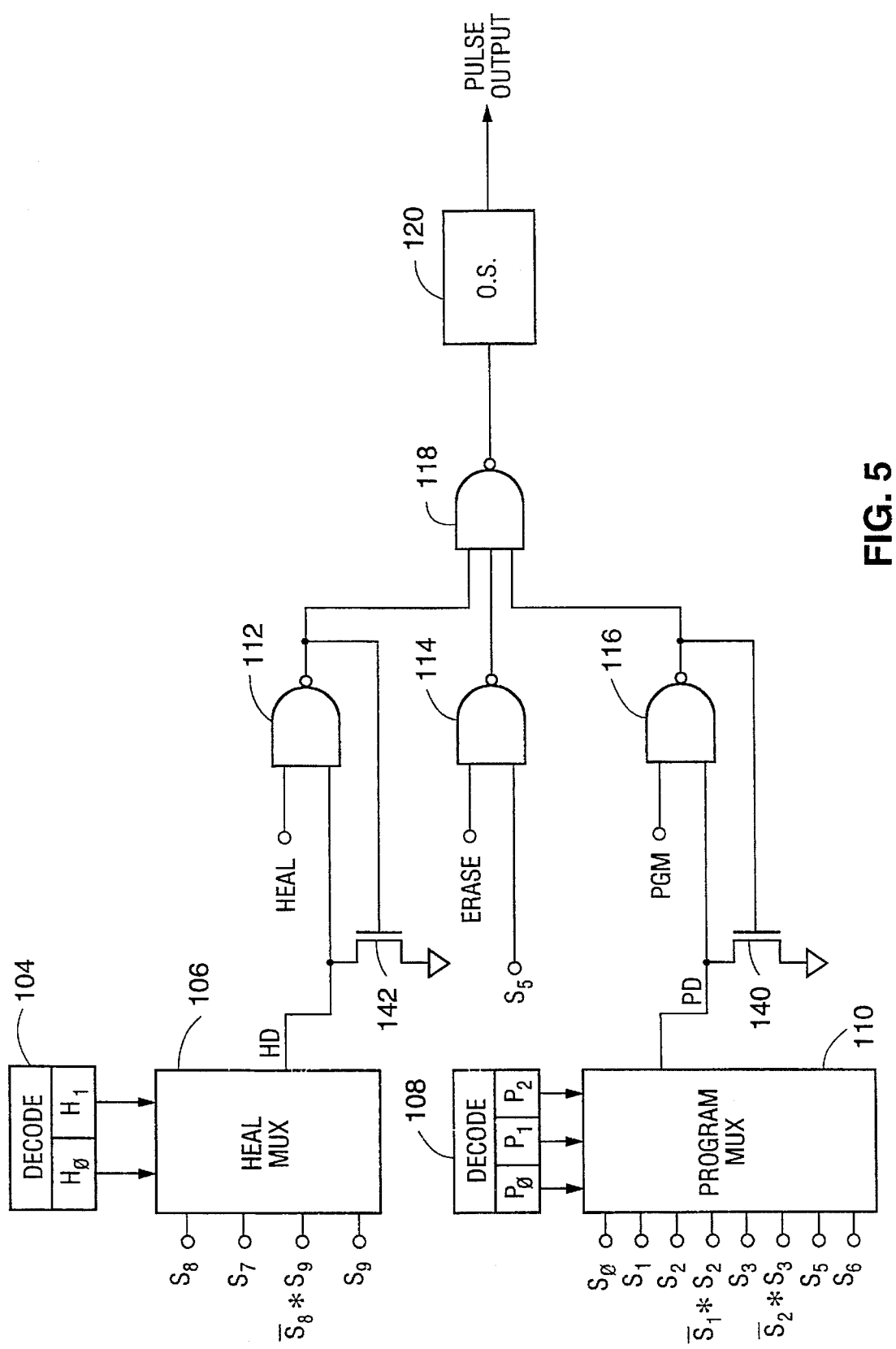
FIG. 5 is a more detailed schematic diagram of part of the decoding circuitry used in association with the subject timer circuit.

FIG. 5 depicts the circuitry for generating the particular pulses used in the Programming, Erasing and Heal memory operations. As will be explained, the duration of the individual pulses can be controlled in order to optimize the pulse width for the particular memory system. The memory Ease operation timing signal is not adjustable in the disclosed exemplary embodiment. Decode $S_5$, taken directly from stage 12E of counter 12, is connected to one input of a two-input NAND gate 114. The second input is connected to a signal ERASE which is active when a memory Erase operation is to be performed. The output of gate 114 is connected to one input of a three input NAND gate 118. The falling output of gate 114 functions to trigger a one shot 120 causing a 50 nanosecond pulse to be produced thereby indicating the end of the erase pulse. During an Erase operation, signal PGM is inactive so that the timer element 10 will output a pulse $S_0$ having a duration of 0.4 milliseconds. Decode $S_5$ will provide an output $2^5$ (32) times the period of the output pulse $S_0$ period of 0.4 milliseconds.

The Heal pulse widths are adjustable and can range from 50 milliseconds to 200 milliseconds. The particular pulse width is based upon the value of two bits of stored programmable parameters $H_0$ and $H_1$. Parameters $H_0$ and $H_1$ are preferably stored in two non-volatile flash memory cells represented by element 104. Table 1 below shows the four combinations of parameters $H_0$ and $H_1$ and the corresponding decodes and pulse durations. A Heal multiplexer 106 is used to select one of four possible decodes based upon the two parameters $H_0$ and $H_1$.

The output HD of Heal multiplexer 106 is connected to one input of two-input NAND gate 112. The second input to the NAND gate is a signal Heal which is produced by the memory system when the

TABLE 1

| DECODE (Heal) $H_0$ | $H_1$ | PULSE WIDTH (milliseconds) |
|---|---|---|
| 0 | 0 | 100 [$S_8$] |
| 0 | 1 | 50 [$S_7$] |
| 1 | 0 | 150 [$\overline{S}_8 * S_9$] |
| 1 | 1 | 200 [$S_9$] | memory system is performing a Heal operation. The output of gate 112 is connected to a second input of three-input NAND gate 118. Thus, when signal Heal is active, one shot 120 is triggered by a selected one of the four possible Heal decodes.

The decode circuitry further includes a Program multiplexer 110 used to select one of eight possible decodes for use in memory program operations. The selected decode is based upon parameters $P_0$, $P_1$ and $P_2$ also preferably stored in three non-volatile memory cells represented by element 108. Table 2 below shows the eight combinations of parameters $P_0$, $P_1$ and $P_2$ and the corresponding output pulse widths used in memory programming operations.

TABLE 2

| DECODE (program) | | | PULSE WIDTH |
|---|---|---|---|
| $P_0$ | $P_1$ | $P_2$ | (microseconds) |
| 0 | 0 | 0 | 6 [$S_2$] |
| 0 | 0 | 1 | 4.5 [$\overline{S}_1 * S_2$] |
| 0 | 1 | 0 | 3 [$S_1$] |
| 0 | 1 | 1 | 1.5 [$S_0$] |
| 1 | 0 | 0 | 9 [$\overline{S}_2 * S_3$] |
| 1 | 0 | 1 | 12 [$S_3$] |
| 1 | 1 | 0 | 48 [$S_5$] |
| 1 | 1 | 1 | 96 [$S_6$] |

The output PD of the Program multiplexer 110 is connected to one input of a two-input NAND gate 116, with the second input being connected to receive an active signal PGM when the memory is to perform a program operation. The decode is forwarded by way of gate 118 to one shot 120 and triggers the one shot on its falling edge. Thus, depending upon the stored parameters $P_0$, $P_1$ and $P_2$, the program pulse outputs will vary as set forth in Table 2 above.

Figure 7:
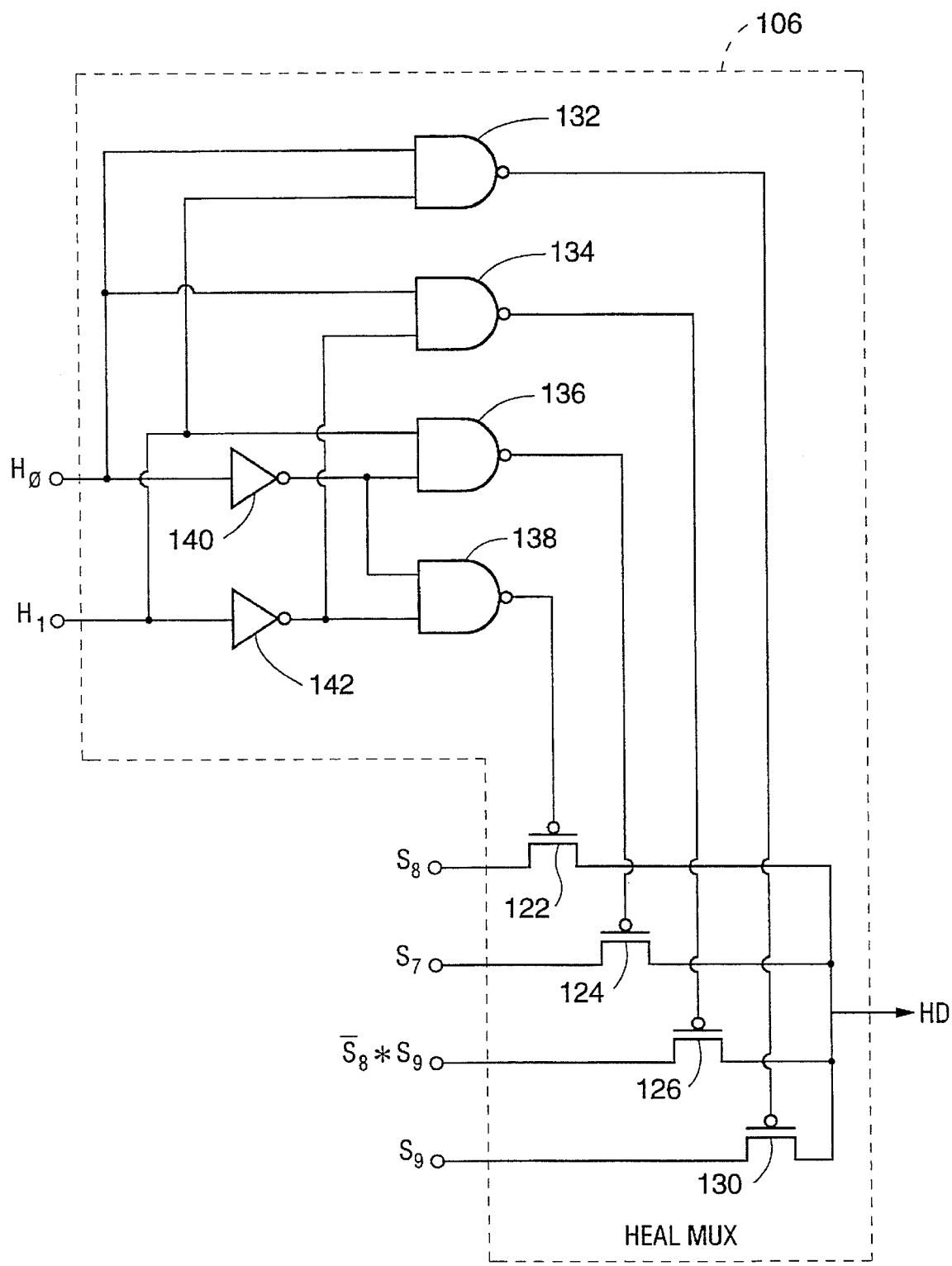
FIG. 7 is a detailed schematic diagram of one of the multiplexer circuits of the FIG. 5 diagram.

FIG. 7 shows a schematic diagram of the Heal multiplexer 106. The Program multiplexer 110 is implemented in a similar manner. The multiplexer 106 includes four P channel pass transistors 122, 124, and 130 which are selectively enabled depending upon the stored parameters $H_0$ and $H_1$ so as to pass the selected decode to the output HD of the multiplexer. Four NAND gates 132, 134, 136 and 138 and two inverter 140 and 142 are used for decoding the parameters $H_0$ and $H_1$ and enabling one of the four NAND gates 132, 134, 136 and 138 based upon the parameters. By way of example, if the parameters $H_0$ and $H_1$ are logic 0 and 1, respectively, both inputs to NAND gate 136 will be a logic 1 so that the logic 0 (low) output of gate 136 will turn pass transistor 124 on. Transistor 124 will forward decode $S_7$ to the multiplexer output HD. The other NAND gates 122, 126 and 130 will all have high (logic 1) outputs under these conditions.

When one or both of the multiplexers 106 and 110 are coupling a low logic level signal, the output of the multiplexers (HD or PD) will be at one threshold voltage above ground due to the fact that the pass transistors include only P channel devices rather than both P and N channel devices. Small geometry transistors 140 and 142 (FIG. 5) are provided for pulling the multiplexer outputs down to approximately ground level under these conditions so that the multiplexer outputs HD and PD are at the proper low level. Transistors 140 and 142 are rendered conductive by the high outputs of NAND gates 112 and 116, respectively, with the outputs of these gates being high when the outputs of the respective multiplexers 106 and 110 are at one threshold voltage above ground potential.

The Heal parameters $H_0$ and $H_1$ and the Program parameters $P_0$, $P_1$, and $P_2$ are selected so as to optimize the performance of the memory system. By way of example, a particular lot of memory integrated circuits may be such that the flash memory cells of the memory array can be most efficiently programmed by application of a pulse of 9 microsecond duration. This would typically be determined at the memory fabrication facility. In that event, the parameters $P_0$, $P_1$, and $P_2$ would be selected to be 1, 0 and 0, respectively as indicated by Table 2. These value will be permanently programmed into the three non-volatile flash memory cells at the fabrication facility. If, for example, preliminary evaluation of a subsequent lot of memory integrated circuits indicates that the optimum pulse duration for programming is 100 microseconds, all that is required is to program 1, 1 and 1 for parameters $P_0$, $P_1$ and $P_2$, respectively, as indicated by Table 2.

Figure 8:
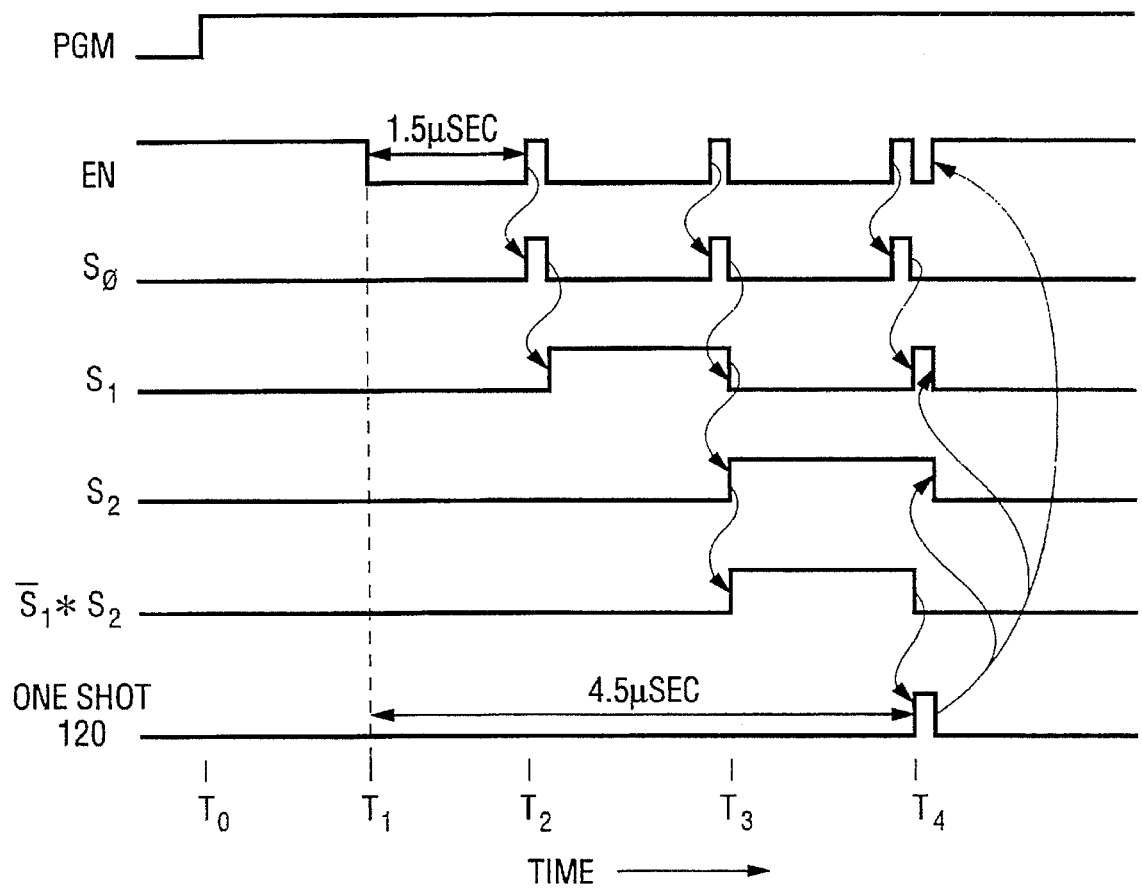
FIG. 8 is a timing diagram illustrating the operation of the timer element and an exemplary decoder output.

FIG. 8 is a timing diagram which further illustrates the operation of the subject invention. FIG. 8 shows the manner in which the 4.5 microsecond pulse is produced in a programming operation. As indicated in Table 2, the stored parameters $P_0$, $P_1$ and $P_2$ are 0, 0 and 1, respectively for producing a programming pulse of this duration. At time $T_0$, signal PGM is made active thereby indicating that one of programming outputs of Table 2 is to be produced. The stored parameters (block 108 of FIG. 5) will cause multiplexer 110 to select decode $\overline{S}_1 * S_2$.

At time $T_1$, signal $\overline{EN}$ is made active (low) by the generation of reset signal Reset (FIG. 4). The current mirror 22 begins to function and the transistor 62 (FIG. 3) which was shorting the timing capacitor 24 is turned off so that the capacitor will begin to be charged by current $I_{CP}$ and the voltage across the capacitor will begin to increase. This is the beginning of the generation of the 4.5 microsecond timing pulse, at which time the programming voltages are applied to the flash memory cell being programmed.

At time $T_2$, the voltage across the timing capacitor 24 is equal to the reference voltage $V_{REF}$. One shot circuit 82 will then issue a pulse in the form of signal $S_0$. Signal $S_0$ is fed back to the timer element by way of NOR gate 84 to generate a subsequent signal $\overline{EN}$. The time period from the falling edge of $\overline{EN}$ at time $T_1$ to the rising edge of the next signal $\overline{EN}$ (or the rising edge of signal $S_0$), at time $T_2$ is 1.5 microseconds. This sequence is periodically repeated so that subsequent signals $S_0$ are produced at time $T_3$, $T_4$, etc.

Signal $S_0$ clocks counter 12, with counter output $S_1$ changing states at the falling edge of signal $S_0$ thereby providing a signal with a nominal period of 3 microseconds as can be seen in the FIG. 8 diagram. Similarly, counter output $S_2$ changes state on the falling edge of output $S_1$ thereby providing a signal with a nominal period of 6 microseconds. The logical combination of $\overline{S}_1 * S_2$ is equivalent to subtracting 1.5 microseconds (signal $S_1$) from 6 microseconds (signal $S_2$) to arrive at the final 4.5 microsecond value. The falling edge of the decode $\overline{S}_1 * S_2$ out of multiplexer 110 triggers one shot 120 by way of gates 116 and 118. Thus, the rising edge of the one shot 120 (or the falling edge of decode $\overline{S}_1$, $S_2$) represents the termination of the 4.5 microsecond time period.

Figure 9:
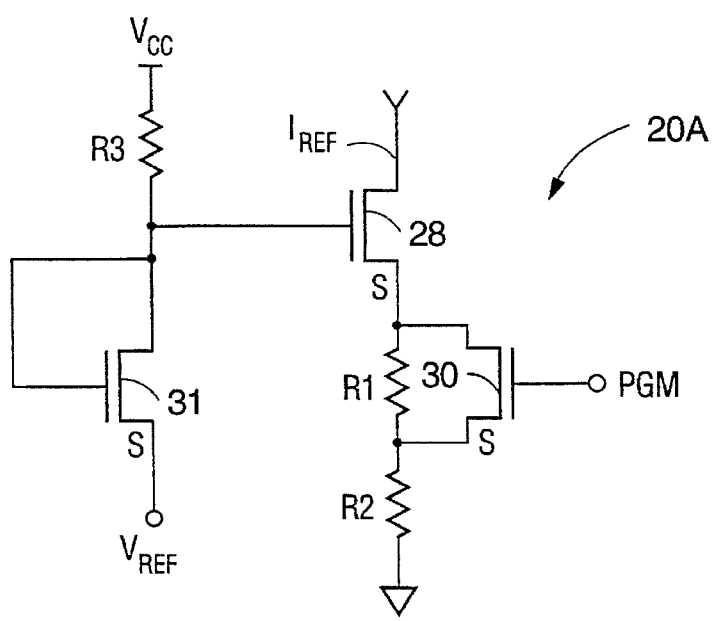
FIG. 9 is a schematic diagram of an alternative current reference circuit.

FIG. 9 depicts an alternative embodiment Current Reference 20A which provides a more stable reference current $I_{REF}$. The reference voltage is applied to the source of an N channel transistor 31, with transistor 31 having its drain and gate connected together. The drain of transistor 31 is connected to the primary supply voltage $V_{CC}$ by way of a resistor R3. The voltage at the gate/drain of transistor 31, which is equal to voltage $V_{REF}$ plus the threshold voltage of transistor 31, is applied to the gate of transistor 28. The voltage at the source of transistor 28 is equal to the gate voltage less the threshold voltage of transistor 28. Assuming that transistors 28 and 31 are the same size and conduct about the same amount of current, it can be seen that the threshold voltages cancel one another out so that the voltage across resistors R1 and R2 is equal to voltage $V_{REF}$. THUS, the reference current $I_{REF}$ through transistor 28 will be very stable and less sensitive to variations in transistor threshold voltages resulting from process variations and the like.

Thus, an adjustable timer circuit has been disclosed capable of providing a very wide range of accurate pulse widths has been disclosed. Although one embodiment has been described in some detail, it is to be understood that certain changes can be made without departing from the spirit and scope of the invention as defined by the appended claims.

I claim:

1. A timer circuit comprising:

a timing capacitor;

a reference voltage source for supplying a first reference voltage, with the first reference voltage being relatively independent of variations in a primary supply voltage for the timer circuit a current source, operably coupled to the reference voltage source, with the current source configured to produce a reference current having a magnitude related to the first reference voltage;

a current divider, operably coupled to the timing capacitor and to the current source, the current divider being configured to produce a unidirectional capacitor current for the timing capacitor, with the capacitor current having a magnitude which is equal to the magnitude of the reference current divided by a value greater than one;

a comparator circuit, operably coupled to the timing capacitor, the comparator circuit being configured to compare a magnitude of a voltage across the timing capacitor with a comparison voltage having a magnitude related to the first reference voltage and producing a comparator output based upon the comparison, with the comparator means including a pair of differentially-connected transistors having respective control terminals connected to receive the voltage across the timing capacitor and to receive the comparison voltage; and output circuitry, operably coupled to the comparator circuit, said output circuitry configured to produce a timer output in response to the comparator output.

2. The timer circuit of claim 1 wherein the current source comprises a first transistor having a gate which is coupled to the first reference voltage.

3. The timer circuit of claim 2 wherein the current source comprises a resistance element connected between a source of the first transistor and a circuit common, with the resistance element having a resistance which determines the magnitude of the reference current and wherein the control terminals of the differentially-connected transistors of the comparator circuit comprise gates of the transistors.

4. The timer circuit of claim 3 wherein the resistance of the resistance element is adjustable in response to a mode control signal.

5. The timer circuit of claim 4 wherein the resistance element comprises first and second resistors connected in series between the source of the first transistor and the circuit common.

6. The timer circuit of claim 5 wherein the current source comprises a second transistor having a drain coupled to a first terminal of the first resistor and a source connected to a second terminal of the first resistor and a gate connected to receive the mode control signal.

7. The timer circuit of claim 6 wherein the first and second transistors are N channel transistors.

8. The timer circuit of claim 1 wherein the current divider comprises a first current mirror having a current mirror input and a current mirror output, with the current mirror input comprising a first transistor structure and the current mirror output comprising a second transistor structure, with the first transistor structure having an effective ratio of channel width to channel length which is greater than an effective ratio of channel width to channel length of the second transistor structure.

9. The timer circuit of claim 8 wherein the first current mirror comprises adjust circuitry configured to adjust the effective ratio of the first transistor structure relative to the effective ratio of the second transistor structure in response to a mode control signal.

10. The timer circuit of claim 9 wherein the first transistor structure is comprised of first and second sub-transistors, with the first sub-transistor having its gate coupled to its drain and to a gate of the second transistor structure.

11. The timer circuit of claim 10 wherein the adjust circuitry comprises an adjust transistor connected between drains of the first and second sub-transistors for selectively coupling together and uncoupling the drains of the first and second sub-transistors in response to the mode control signal.

12. The timer circuit of claim 11 wherein the current mirror input is connected to conduct the reference current.

13. The timer circuit of claim 12 wherein the first and second sub-transistors of the first transistor structure and the second transistor structure are P channel transistors.

14. The timer circuit of claim 12 wherein the current divider comprises a second current mirror having a current mirror input and a current mirror output, with the current mirror input connected to conduct current from the current mirror output of the first current mirror, with the current mirror input comprising a first transistor structure and with the current output comprising a second transistor structure, with the first transistor structure of the second current mirror having an effective ratio of channel width to channel length which is equal to or greater than an effective ratio of channel width to channel length of the second transistor structure of the second current mirror.

15. The timer circuit of claim 14 wherein the second current mirror comprises adjust circuitry configured to adjust the effective ratio of the first transistor structure relative to the effective ratio of the second transistor structure of the second current mirror in response to the mode control signal.

16. The timer circuit of claim 15 wherein the first transistor structure of the second current mirror is comprised of first and second sub-transistors, with the first sub-transistor of the second current mirror having its gate coupled to its drain and to a gate of the second transistor structure of the second current mirror.

17. The timer circuit of claim 16 wherein the adjust circuitry of the second current mirror comprises an adjust transistor connected between the drains of the first and second sub-transistors of the second current mirror for selectively coupling together and uncoupling the drains of the first and second sub-transistors in response to the mode control signal.

18. The timer circuit of claim 17 wherein the first and second sub-transistors of the first transistor structure of the second current mirror and the second transistor structure of the second current mirror are N channel transistors.

19. The timer circuit of claim 1 wherein the timer output has a start point and a stop point and wherein the capacitor current causes the voltage across the timing capacitor to change from a first level at the start point to a second level and further comprising retrigger circuitry configured to cause the voltage across the timing capacitor to change from the second level to the first level at which time the timer output is at the stop point.

20. The timer circuit of claim 19 further comprising frequency divider circuitry configured to produce a plurality of frequency divided outputs, each having a period which is a different multiple of a period between the timer output start and stop points.

21. The timer circuit of claim 20 comprising decode circuitry configured to decode selected ones of the frequency divided outputs and to provide a decoded output timing pulse having a period based upon the selected decodes.

22. The timer circuit of claim 21 wherein the decode circuitry comprises parameter storage circuitry configured to store decode parameters used to determine which decodes are selected.

23. The timer circuit of claim 22 wherein the parameter storage circuitry comprises non-volatile memory cells for storing the decode parameters.

24. The timer circuit of claim 1 wherein the elements of the circuit are embodied in a single integrated circuit.

25. An adjustable timer circuit comprising:

a timing capacitor;

a source of timing capacitor current having a magnitude which is derived from a reference voltage, with the timing capacitor current causing a voltage on the capacitor to change from a first state to a second state;

a voltage comparator connected to compare a voltage on the timing capacitor with a comparison voltage and producing an output when the voltage on the capacitor is at the second state;

a reset circuit for causing the voltage on the timing capacitor to return to the first state in response to the comparator output; and a frequency divider responsive to the comparator output for providing a plurality of frequency divided outputs;

a decoder circuit for decoding selected ones of the frequency divided outputs based upon selected decode parameters; and a plurality of programmable non-volatile memory cells for storing the selected decode parameters.

26. The timer circuit of claim 25 wherein the comparison voltage is derived from the reference voltage and the source of timing capacitor current includes a current source for producing a reference current based upon the reference voltage and a current divider for reducing a magnitude of the reference current down to a magnitude of the timing capacitor current.

27. The timer circuit of claim 26 wherein the current divider includes a first current mirror having a current mirror input transistor having its drain and gate coupled together and which conducts the reference current and a current mirror output transistor having its gate coupled to the gate of the current mirror input transistor and which conducts a current which is less than the reference current.

28. The timer circuit of claim 27 wherein the current divider is an adjustable current divider which adjusts the magnitude of the timing capacitor current in response to a mode control signal.

29. The timer circuit of claim 28 wherein the current mirror input transistor and the current mirror output transistor have relative ratios of channel width to the channel length which can be altered in response to the mode control signal.

30. The timer circuit of claim 29 wherein the elements of the timer circuit are embodied in an integrated circuit.

31. A timer circuit comprising:

a timing capacitor;

a current source configured to produce a reference current having a magnitude derived from a first reference voltage, with the current source comprising first adjust circuitry configured to adjust the magnitude of the reference current in response to a mode control signal;

a current divider operably coupled to the current source and to the timing capacitor, said current divider being configured to produce a unidirectional timing capacitor current in the timing capacitor having a magnitude which is equal to the magnitude of the reference current divided by a value greater than one, with the value being adjustable in response to the mode control signal;

a comparator circuit connected to compare a magnitude of a voltage produced across the timing capacitor with a comparison voltage and producing a comparator output based upon the comparison; and output circuitry configured to produce a timer output in response to the comparator output.

32. A timer circuit comprising:

a timing capacitor;

a current source configured to produce a reference current having a magnitude derived from a first reference voltage;

a current divider operably coupled to the current source and to the timing capacitor, said current divider being configured to produce a timing capacitor current for the timing capacitor having a magnitude which is equal to a magnitude of the reference current divided by a value greater than one, with the current divider comprising a first current mirror having a current mirror input and a current mirror output, with the current mirror input comprising a first transistor structure and with the current mirror output comprising a second transistor structure, with the first transistor structure having an effective ratio of channel width to channel length which is greater than an effective ratio of channel width to channel length of the second transistor structure, and with one of the first and second transistor structures comprising first and second sub-transistors, with a drain and a gate of the second sub-transistor coupled to a gate of the other of the first and second transistor structures, and with the first current mirror comprising first adjust circuitry for selectively coupling and decoupling the first and second sub-transistors in parallel in response to a mode control signal;

a comparator circuit connected to compare a magnitude of a voltage produced across the timing capacitor with a comparison voltage and producing a comparator output based upon the comparison; and output circuitry configured to produce a timer output in response to the comparator output.

33. The timer circuit of claim 32 wherein the current mirror input comprises the first transistor structure, with the first sub-transistor having its gate coupled to its drain and to a gate of the second transistor structure.

34. The timer circuit of claim 33 wherein the first adjust circuitry comprises an adjust transistor connected between drains of the first and second sub-transistors for selectively coupling together and uncoupling the drains of the first and second sub-transistors in response to the mode control signal.

35. The timer circuit of claim 34 wherein the current mirror input is connected to conduct the reference current.

36. The timer circuit of claim 35 wherein the first and second sub-transistors of the first transistor structure and the second transistor structure comprise P channel transistors.

37. The timer circuit of claim 34 wherein the current divider comprises a second current mirror having a current mirror input and a current mirror output, with the current mirror input connected to conduct current from the current mirror output of the first current mirror, with the current mirror input comprising a first transistor structure and with the current mirror output comprising a second transistor structure, with the first transistor structure of the second current mirror having an effective ratio of channel width to channel length which is equal to or greater than an effective ratio of channel width to channel length of the second transistor structure of the second current mirror.

38. The timer circuit of claim 37 wherein the second current mirror comprises second adjust circuitry configured to alter the effective ratio of the first transistor structure relative to the effective ratio of the second transistor structure of the second current mirror in response to the mode control signal.

39. The timer circuit of claim 38 wherein the first transistor structure of the second current mirror is comprised of first and second sub-transistors, with the first sub-transistor of the second current mirror having its gate coupled to its drain and to a gate of the second transistor structure of the second current mirror.

40. The timer circuit of claim 39 wherein the second adjust circuitry comprises an adjust transistor connected between the drains of the first and second sub-transistors of the second current mirror for selectively coupling and uncoupling the drains of the first and second sub-transistors together in response to the mode control signal.

41. The timer circuit of claim 40 wherein the first and second sub-transistors of the first transistor structure of the second current mirror and the second transistor structure of the second current mirror comprise N channel transistors.

42. A timer circuit comprising:

a timing capacitor;

a current source configured to produce a reference current having a magnitude derived from a first reference voltage;

a current divider operably coupled to the current source and the timing capacitor, the current divider being configured to produce a timing capacitor current in the timing capacitor having a magnitude which is equal to the magnitude of the reference current divided by a value greater than one;

a comparator circuit for comparing a magnitude of a voltage produced across the timing capacitor with a comparison voltage and producing a comparator output based upon the comparison;

output circuitry configured to produce a timer output in response to the comparator output, with the timer output having a start point and a stop point and wherein the timing capacitor current causes the voltage across the timing capacitor to change from a first level at the start point to a second level at the stop point;

retrigger circuitry configured to cause the voltage across the timing capacitor to change from the second level to the first level at which time the timer output is at the timer output stop point; and a frequency divider circuit operably coupled to the output circuitry, said frequency divider circuit being configured to produce a plurality of frequency divided outputs, each having a period which is a different multiple of a period between the timer output start and stop points.

43. The timer circuit of claim 42 comprising a decoder circuit configured to decode selected ones of the frequency divided outputs and providing a decoded output timing pulse having a period based upon the selected decodes.

44. The timer circuit of claim 43 wherein the decode circuit comprises parameter storage circuitry configured to store decode parameters used to determine which decodes are selected.

45. The timer circuit of claim 44 wherein the parameter storage circuitry comprises non-volatile memory cells for storing the decode parameters.

46. The timer circuit of claim 32 wherein the first transistor structure comprises the first and second sub-transistors and wherein the first adjust circuitry operates to couple and decouple drains of the first and second sub-transistors.

47. The timer circuit of claim 46 wherein the first adjust circuitry comprises an adjust transistor interconnecting the respective drains of the first and second sub-transistors.

48. The timer circuit of claim 47 wherein the first and second transistor structures and the adjust transistor comprise N channel transistors.

49. The timer circuit of claim 47 wherein the first and second transistor structures and the adjust transistor comprise P channel transistors.

50. The timer circuit of claim 32 further comprising a reference voltage source for supplying the first reference voltage, with the first reference voltage being relatively independent of variations in a primary supply voltage for the timer circuit and wherein the reference current and the comparison voltage are related to the first reference voltage.

51. A timer circuit comprising:

a timing capacitor;

a current source configured to produce a reference current having a magnitude which is relatively independent of a primary supply voltage for the timer circuit;

a current divider, operably coupled to the current source, the current divider being configured to produce a unidirectional capacitor current for the timing capacitor, with the capacitor current having a magnitude which is equal to the magnitude of the reference current divided by a value greater than one;

a comparator circuit, operably coupled to the timing capacitor, the comparator circuit configured to provide a comparator output indicative of a magnitude of a voltage across the timing capacitor relative to a threshold voltage;

output circuitry, operably coupled to the comparator circuit, said output circuitry configured to produce a timer output in response to the comparator output, with the timer output having a start point and a stop point and wherein the capacitor current causes the voltage across the timing capacitor to change from a first level at the start point to a second level;

retrigger circuitry configured to cause the voltage across the timing capacitor to change from the second level to the first level at which time the timer output is at the stop point; and frequency divider circuitry configured to produce a plurality of frequency divided outputs, each having a period which is a different multiple of a period between the timer output start and stop points.

52. The timer circuit of claim 51 further comprising a reference voltage source for supplying a reference voltage, with the current source being configured to produce the reference current which is related to the reference voltage and wherein the comparison threshold voltage is related to the reference voltage.

53. A method of generating a timing signal comprising the following steps:

generating a reference current;

receiving a mode control signal;

dividing the reference current by a divisor value to produce a unidirectional output current, with the divisor value being switchable between at least two values based upon a state of the mode control signal;

applying the output current to a timing capacitor so as to cause a voltage across the capacitor to change from a first level to a second level;

causing the voltage across the capacitor to change from the second level to the first level; and generating a timing signal having a period which is set by a time required for the voltage capacitor to change from the first level to the second level.

54. The method of claim 53 wherein the step of dividing the reference current comprises the step of generating a gate-source voltage in a first transistor structure indicative of a magnitude of the reference current and applying the gate-source voltage to the gate and source of a second transistor structure.

55. The method of claim 54 wherein the step of dividing the reference current includes the step of adjusting an effective ratio of channel width to channel length of at least one of the first and second transistor structures in response to the mode control signal.

56. The method of claim 55 wherein the at least one of the first and second transistor structures comprises a plurality of sub-transistors and the step of adjusting comprises the steps of coupling the sub-transistors together and de-coupling the sub-transistors in response to the mode control signal.

57. A method of generating a timing signal comprising the following steps:

receiving a reference voltage which is relatively constant in magnitude;

generating a reference current having a magnitude which is related to the reference voltage magnitude;

dividing the reference current by a positive divisor value greater than one to produce an output current;

applying the output current to a timing capacitor so as to cause a voltage across the capacitor to change from a first level to a second level;

providing a comparison voltage having a magnitude which is related to the magnitude of the reference voltage;

comparing the voltage across the capacitor with the comparison voltage to determine when the voltage across the capacitor is at the second level;

causing the voltage across the capacitor to change from the second level to the first level; and generating a timing signal having a period which is set by a time required for the voltage capacitor to change from the first level to the second level.

58. A method of generating a timing signal comprising the following steps:

generating a reference current;

dividing the reference current by a positive divisor value greater than one to produce an output current;

applying the output current to a timing capacitor so as to cause a voltage across the capacitor to change from a first level to a second level;

providing a comparison voltage having a magnitude which is related to the magnitude of a reference voltage;

comparing the voltage across the capacitor with the comparison voltage to determine when the voltage across the capacitor is at the second level;

causing the voltage across the capacitor to change from the second level to the first level;

generating a timing signal having a period which is controlled by a time required for the voltage capacitor to change from the first level to the second level;

frequency dividing the timing signal so as to produce a plurality of frequency divided outputs; and decoding selected ones of the frequency divided outputs based upon selected decode parameters.

59. The method of claim 58 further including the step of storing the selected decode parameters in non-volatile memory cells.

* * * * *

UNITED STATES PATENT AND TRADEMARK OFFICE
CERTIFICATE OF CORRECTION

PATENT NO. : 5,629,644
DATED : May 13, 1997
INVENTOR(S) : Christophe J. Chevallier It is certified that error appears in the above-indentified patent and that said Letters Patent is hereby corrected as shown below:

In column 11, line 7, please delete "means" and insert --circuit-- therefor.

Signed and Sealed this

Seventh Day of July, 1998

Attest:

BRUCE LEHMAN

Attesting Officer

Commissioner of Patents and Trademarks